United States Patent [19]

Kobayashi et al.

[11] Patent Number: 5,304,405
[45] Date of Patent: Apr. 19, 1994

[54] THIN FILM DEPOSITION METHOD AND APPARATUS

[75] Inventors: Masahiko Kobayashi; Kenji Numajiri, both of Fuchu, Japan

[73] Assignee: Anelva Corporation, Tokyo, Japan

[21] Appl. No.: 806,225

[22] Filed: Dec. 13, 1991

[30] Foreign Application Priority Data

Jan. 11, 1991 [JP] Japan .................. 3-002211

[51] Int. Cl.5 .............................................. B05D 3/06
[52] U.S. Cl. .................... 427/534; 427/535; 427/309; 156/626; 156/643; 156/646
[58] Field of Search ........... 427/534, 535, 309; 156/646, 643, 626

[56] References Cited

U.S. PATENT DOCUMENTS

| | | | |
|---|---|---|---|
| 4,579,609 | 4/1986 | Reif et al. | 427/534 |
| 4,877,757 | 10/1989 | York et al. | 427/534 |
| 4,928,537 | 5/1990 | Liu et al. | 377/10 |
| 5,015,330 | 5/1991 | Okumura et al. | 156/643 |

FOREIGN PATENT DOCUMENTS

| | | |
|---|---|---|
| 63-39676 | 8/1988 | Japan . |
| 1-315317 | 12/1989 | Japan . |
| 2-39530 | 2/1990 | Japan . |
| 2-89313 | 3/1990 | Japan . |
| 2-94522 | 4/1990 | Japan . |
| 2-183531 | 7/1990 | Japan . |
| 2-214118 | 8/1990 | Japan . |
| 2-250325 | 10/1990 | Japan . |
| WO91/07773 | 5/1991 | World Int. Prop. O. . |

Primary Examiner—Shrive Beck
Assistant Examiner—David M. Maiorana
Attorney, Agent, or Firm—Oliff & Berridge

[57] ABSTRACT

A thin film deposition apparatus has at least two vacuum chambers, one of which is an etching vacuum chamber for cleaning wafer surfaces. The etching vacuum chamber includes a first gas introduction system for introducing an etching gas, and a second gas introduction system for introducing a reactive gas for use in the cleaning whereby silicon deposited films will be removed. A thin film deposition method which may be carried out by the apparatus includes a cleaning process performed in advance of thin film deposition process for depositing a thin film on the wafer surfaces. In the cleaning process, the wafer surfaces are etched with the etching gas, the wafers are thereafter taken out of the chamber, a simulation wafer for particle checking is transferred into the chamber, and the degree to which particles have been generated is checked with the simulation wafer. When required, the reactive gas is introduced thereafter to gasify the deposited films and the particles. The resultant gas is evacuated to the outside of the vacuum chamber.

9 Claims, 6 Drawing Sheets

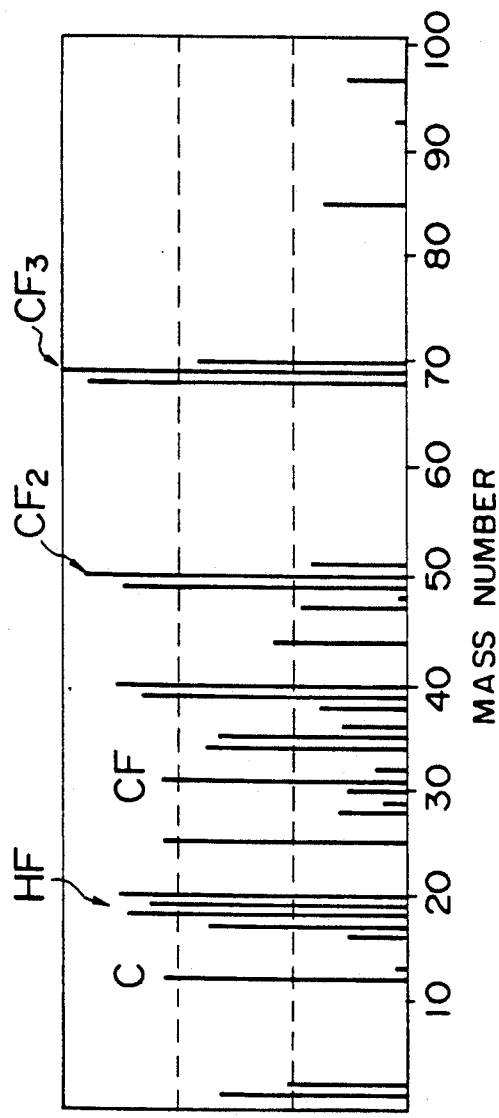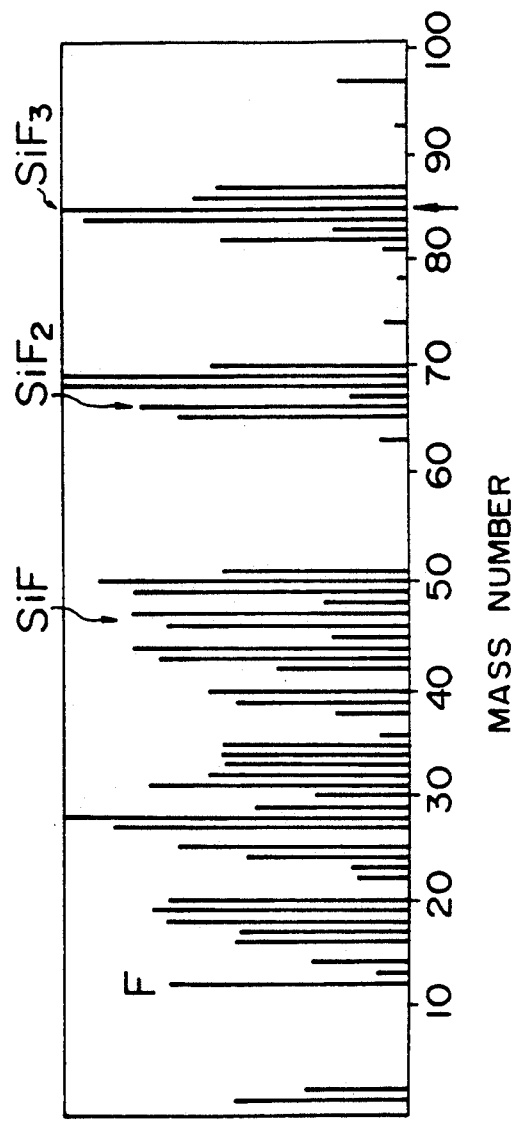
FIG. 5A
FIG. 5B

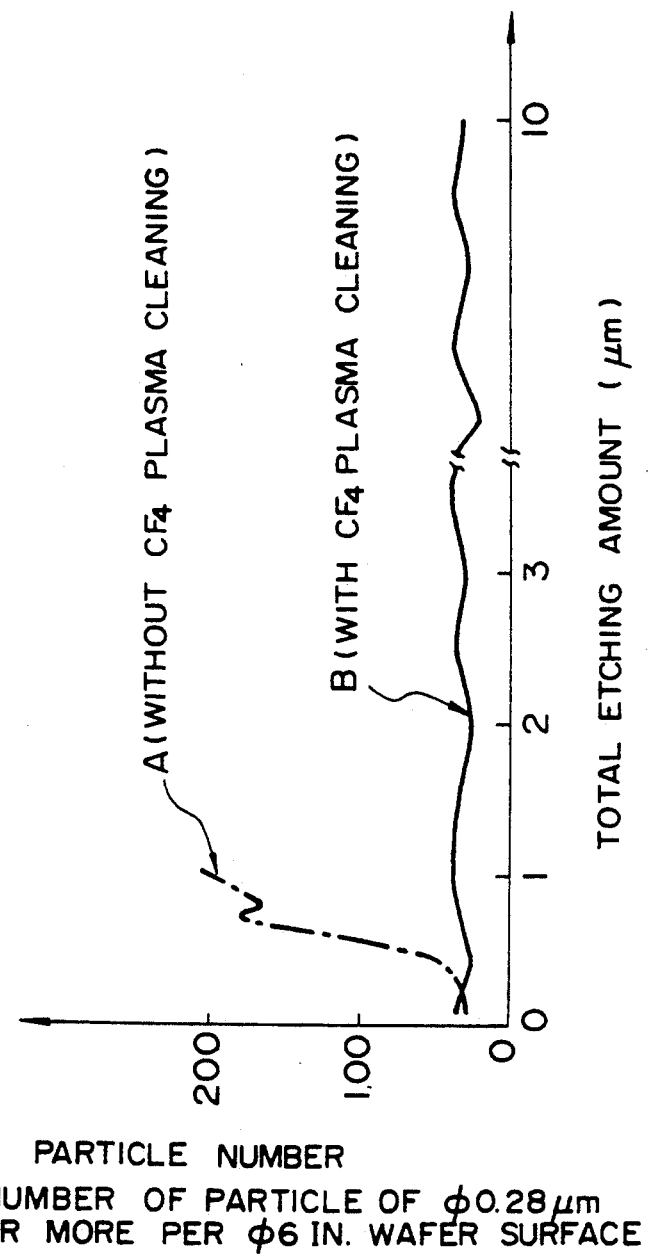

THIN FILM DEPOSITION METHOD AND APPARATUS

BACKGROUND OF THE INVENTION

1. Field of the Invention

The present invention relates to a thin film deposition method and a thin film deposition apparatus. More particularly, it relates to a thin film deposition method adapted to check and determine the number of particles generated in an etching process for the purpose of wafer surface cleaning, which is performed in advance of a thin film deposition process, and to remove undesirably deposited films from which the particles may generate, the method thereby enabling appropriate and easy removal of the particles. Furthermore, it relates to a thin film deposition apparatus having an arrangement for the removal of the particles.

2. Description of the Related Art

A sputtering apparatus for mass-production performs the processing of a plurality of wafers by employing a multi-chamber structure which mainly comprises a plurality of processing chambers. The sputtering apparatus having the multi-chamber structure has arrangements for preventing air in the atmosphere from entering the inside of the apparatus, and for preventing target materials in the individual processing chambers from being contaminated with substances introduced from other chambers. With such arrangements, therefore, the apparatus is able to perform sputtering which allows thin films having stable quality levels to be formed. Conventionally, in general, with a view to removing oxide films or contamination naturally generated on the surfaces of wafers, an etching process has been performed before the sputtering process, in which the wafer surfaces are subjected to etching. In the etching process, discharge is caused in, primarily, an argon (Ar) gas, so as to etch the wafer surfaces (as disclosed in, for instance, Japanese Patent Laid-Open No. 2-183531). In general, the etching process is referred to as "a pretreatment process" for fabricating a semiconductor circuit. The etching process is generally performed in a vacuum chamber which is, in the sputtering apparatus, used exclusively for this purpose.

A conventional thin film deposition method including the etching process as the pretreatment process in advance of the sputtering process, has the following problem in relation to particles.

A phenomenon caused by the etching of the conventional method will be described with reference to FIGS. 7 and 8. Referring to FIG. 7, in a vacuum chamber 71 in which etching is to be performed, a wafer 73 (for example, a silicon substrate) held by a wafer holder 72 is disposed at an upper position. A counter electrode 75 housing a magnet 74 for magnetron discharge is disposed at a lower position in the vacuum chamber 71. The vacuum chamber 71 is equipped with a main pump 76, and an Ar gas introducing system 77. The main pump 76 is comprised of a high vacuum pump such as a cryopump or a turbo-molecular pump. A high-frequency power source 79 is connected between the wafer holder 72 and the counter electrode 75. After a predetermined pressure has been attained and set in the chamber 71 by the main pump 76, Ar gas is introduced into the chamber 71 by the Ar gas introducing system 77. Thereafter, when a high-frequency power is applied by the high-frequency power source 79, magnetron discharge is caused by crossed electric and magnetic fields. When the magnetron discharge occurs, its self-bias effect causes argon ions 80 to be impinged onto the surface (facing the counter electrode 75) of the wafer 73, thereby etching the surface of the wafer 73.

FIG. 8 shows a state in the above-described etching (i.e., etching process as the pretreatment process). Referring to FIG. 8, when the surface of the wafer 73 is etched with the argon ions 80, silicon atoms 81 are ejected by the etching, and deposit on the counter electrode 75 and the inner wall of the vacuum chamber 71, etc., thereby forming silicon films. When the silicon films have grown to have a certain film thickness, they exfoliate due to internal stress, thereby causing the generation of a great number of particles in the vacuum chamber 71. When a great number of particles are thus generated, some of them may adhere to the surface of the wafer 73, thereby entailing the risk of a serious adverse influence on fine wiring structures. In consequence, the above-described phenomenon results in the problem of a reduction in the yield of products.

A conventional method directed to preventing the generation of particles is basically a method which copes with the silicon films formed on the inner wall of the vacuum chamber 71 by arranging shield plates 82 in the vicinity of the inner wall surfaces, and replacing the shield plates 82 when the silicon films have grown to have a predetermined thickness. The conventional method copes with the film formation on the counter electrode 75 by directly replacing the counter electrode itself when the thickness of the silicon films has become a predetermined value. However, these operations of the conventional method are performed by interrupting the successive process, and rendering the inside of the vacuum chamber exposed to air. The conventional method is disadvantageous in that the production efficiency of the thin film deposition, and hence, that of the semiconductor device fabrication, drops. For instance, when fifty wafers are etched and, thereafter, the shield plates as well as the counter electrode are replaced, the entire process requires a period of about six hours.

Other methods have been proposed to remove undesirably deposited films from the inner wall of the vacuum chamber (or vessel) and the counter electrode, as well as the particles generated from the films or the same. In these methods, a gas for cleaning is introduced into the vacuum vessel, and dry etching, or plasma etching, is performed in order to remove the undesired deposited films on the inner wall of the vacuum vessel, etc. (Japanese Patent Laid-Open Nos. 2-94522, 1-315137, 2-214118, and 2-250325). With these methods for the removal of the deposited films on the vacuum vessel inner wall, etc. disclosed in the above-identified documents, it is possible to perform a removing operation while the inside of the vacuum vessel is maintained in a vacuum condition. Accordingly, it is possible to improve the speed of the removing operation while keeping the vacuum chamber vacuum. However, the documents do not specifically describe the conditions under which and the timing at which the removing operation should be performed, thus making it necessary for the methods to be further improved when they are to be actually put into practice.

Other related arts are respectively described in, for example, Japanese Patent Laid-Open Nos. 2-39530, 2-89313, and Japanese Patent Post Exam Publin No. 63-39676.

The above-described problem that the sputtering apparatus for mass-production meets, may also arise in other similar thin film deposition apparatuses.

SUMMARY OF THE INVENTION

An object of the present invention is to provide a thin film deposition method and a thin film deposition apparatus that is capable of: accurately determining the number of particles generated in an etching process, which is a process in a thin film deposition processing, performed for the purpose of cleaning a wafer surface; and removing, at an appropriate timing, undesired deposited films on a vacuum vessel inner wall and the particles generated from the films or the same. The method and apparatus thus curtails the period of time required for the apparatus maintenance necessary for the thin film deposition, and facilitates the maintenance, while enabling the operation of removing the deposited films on the vacuum vessel inner wall to be performed exactly and at a high operational efficiency.

According to the present invention, there is provided a thin film deposition method of depositing a thin film on wafers by a sputtering process (or a like process), the thin film deposition method further comprising: a cleaning step wherein, before the sputtering process takes place, a wafer is transferred into a vacuum vessel for wafer surface cleaning, which is among a group of vacuum vessels and which is to be used to clean a surface of the wafer, the wafer is disposed in the vacuum vessel for wafer surface cleaning with the surface of the wafer to be processed being directed downward, and, in the vacuum vessel for wafer surface cleaning, an etching gas preferably an inert gas, is introduced to the inside of the vessel and plasma is generated, thereby cleaning the surface of the wafer to be processed, the cleaning step being repeatedly executed with respect to a predetermined number of wafers; a particle checking step wherein, after the cleaning step has been executed with respect to the predetermined number of the wafers, a simulation wafer for particle checking is transferred into the vacuum vessel for wafer surface cleaning, and particles adhered to the simulation wafer are checked; a particle generated number determining step wherein a determination is made as to whether or not the number of the checked particles is above a predetermined standard; a gasifying step wherein, when the number of the checked particles is above the predetermined standard, a reactive gas is introduced into the vacuum vessel for wafer surface cleaning and plasma is generated therein, so as to gasify, with the plasma, deposited films and particles which have been generated in the vacuum vessel for wafer surface cleaning; and an evacuation step wherein the deposited films and the particles which have been gasified are evacuated to the outside of the vacuum vessel for wafer surface cleaning.

With the above-specified thin film deposition method according to the present invention, after etching has been performed as a pretreatment process in advance of sputtering, the degree of generation (more specifically, the number) of the particles is checked. As a result of the checking, when it is necessary to perform removing, the deposited films and the particles which have been generated in the vessel for wafer surface cleaning are gasified, and are then evacuated to the outside of the vacuum vessel. During the gasifying of the deposited films and the like, the product wafer lot is already on the outside of the wafer surface cleaning vacuum chamber, having been taken out therefrom.

Preferably, the thin film deposition method according to the present invention has an evacuation step which comprises heating inner walls of the vacuum vessel for wafer surface cleaning and shield plates disposed in the vicinity of the inner walls, and evacuating the deposited films and the particles so that the internal pressure within the vacuum vessel for wafer surface cleaning becomes a predetermined pressure. This predetermined pressure is approximately from $10^{-6}$ to $10^{-7}$ Torr.

Preferably, in the thin film deposition method according to the present invention, the surface of the wafer to be processed is directed downward when the wafer is being transferred into or out of the vacuum vessel for wafer surface cleaning.

Preferably, in the thin film deposition method according to the present invention, the predetermined standard employed in the particle generated number determining step is the existence of not less than thirty particles of a particle size of 0.28 $\mu$m or more in diameter on the surface of the simulation wafer of a six-inch diameter.

According to the present invention, there is also provided a thin film deposition apparatus having at least two vacuum vessels, one of the vacuum vessels being for wafer surface cleaning in which an etching process is performed as a pretreatment process before a sputtering process (or a like process), the vacuum vessel for wafer surface cleaning comprising: evacuating means for vacuum evacuating the interior of the vacuum vessel for wafer surface cleaning; first gas introducing means for introducing an etching gas; second gas introducing means for introducing a reactive gas for gasifying deposited films and particles; substrate holding means disposed at an upper position inside the vacuum vessel; discharge generating means disposed at a lower position inside the vacuum vessel; shield plates disposed along inner wall portions of the vacuum vessel; and heating means for heating the inner wall portions of the vacuum vessel and the shield plates.

The above-specified thin film deposition apparatus according to the present invention has the vacuum chamber for cleaning the wafer surface to be processed. And it includes gas introducing systems, provided for the wafer surface cleaning vacuum chamber, which comprise, not only the etching gas introducing system, but also the reactive gas introducing system for performing cleaning in order to remove, after the etching, the deposited films and the particles generated by exfoliation of the deposited films. With this arrangement, after the etching has been performed, the degree of particle generation is checked. Then, in accordance with the results of the checking, the inside of the vacuum vessel is cleaned at an appropriate timing by employing plasma, thereby gasifying the deposited films and the like, which are then evacuated to the outside of the vacuum vessel. If the heating means is used to heat the inner wall portions of the vessel, etc., the gasifying of the deposited films and the like is promoted.

BRIEF DESCRIPTION OF THE DRAWINGS

FIGS. 5A and 5B are diagrams respectively showing a residue gas spectrum before discharge in a reactive gas and that after discharge in the reactive gas;

FIG. 6 is a graph showing particle data obtained by conducting both a conventional sputtering method and a sputtering method in accordance with the present invention;

DESCRIPTION OF THE PREFERRED EMBODIMENTS

Embodiments of a thin film deposition method and a thin film deposition apparatus according to the present invention will be described with reference to the accompanying drawings. Some of these drawings respectively show the configuration of the apparatus schematically and, accordingly, the size, the configuration, the positional relationship, etc. of various component members of the apparatus are schematically illustrated. This is intended nothing but to facilitate readers' understanding of the present invention.

Figure 1:
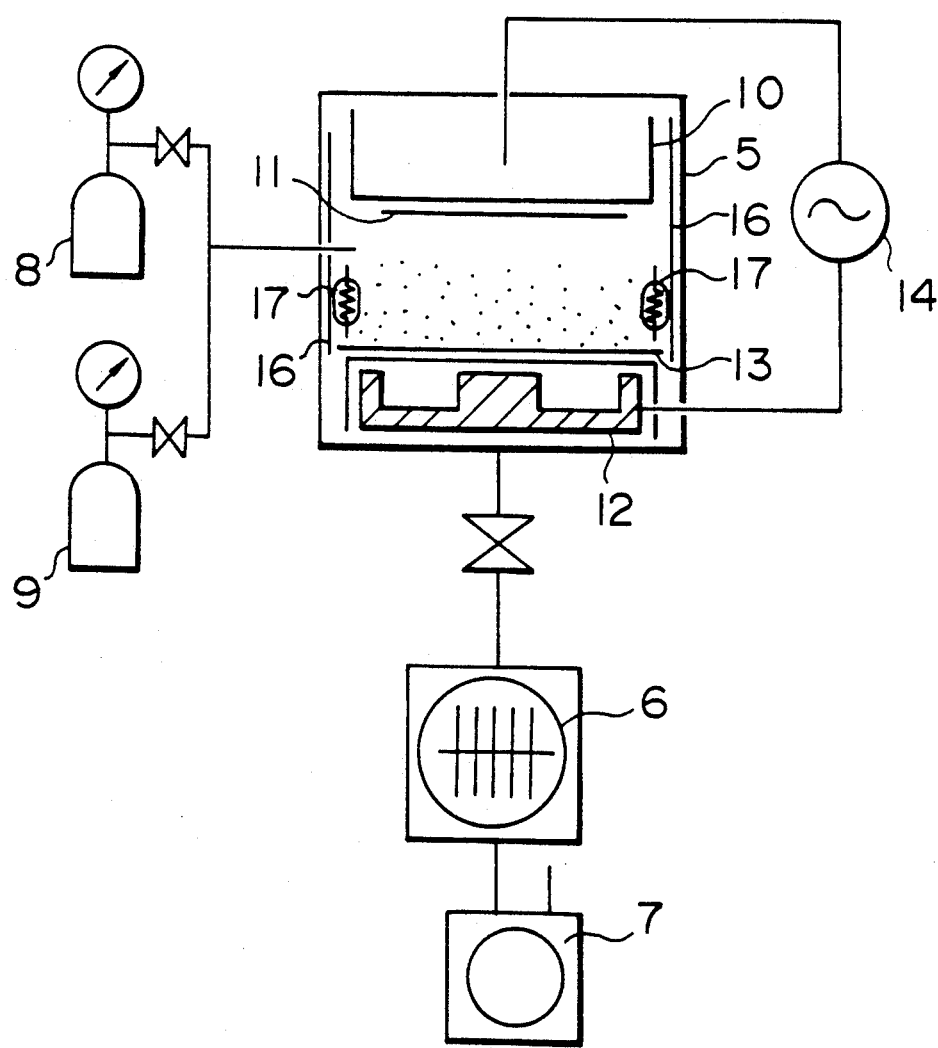
FIG. 1 is a structural view of a vacuum vessel of a sputtering apparatus embodiment according to the present invention, the vacuum vessel being for use in an etching process for cleaning a wafer surface.
Figure 2:
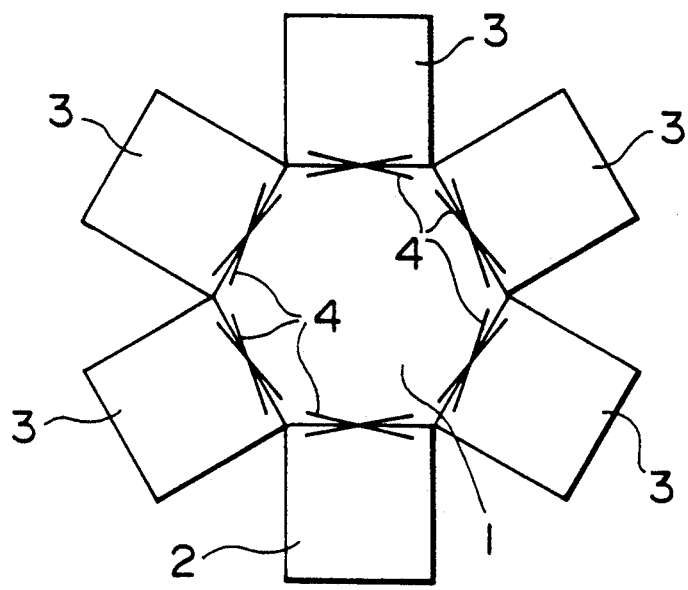
FIG. 2 is a schematic plan view of a sputtering apparatus having a multi-chamber structure.

The thin film deposition apparatus is embodied by a sputtering apparatus. It has a multi-chamber structure. Specifically, as shown in FIG. 2, the sputtering apparatus having the multi-chamber structure includes a separation chamber 1 at a central location, and a load lock chamber 2 and a plurality of processing chambers 3 arranged around the separation chamber 1, the chambers 2 and 3 serving as vacuum vessels. A plurality of gate valves 4 are provided between the separation chamber 1 and the surrounding chambers 2 and 3. FIG. 1 shows the configuration of a vacuum chamber which is, among the plurality of processing chambers 3, to be used exclusively for the purpose of etching. In the vacuum chamber shown in FIG. 1, an etching process for cleaning wafer surfaces is performed as a pretreatment process in advance of a sputtering process to be performed in the other vacuum chambers for sputtering.

Figure 3:
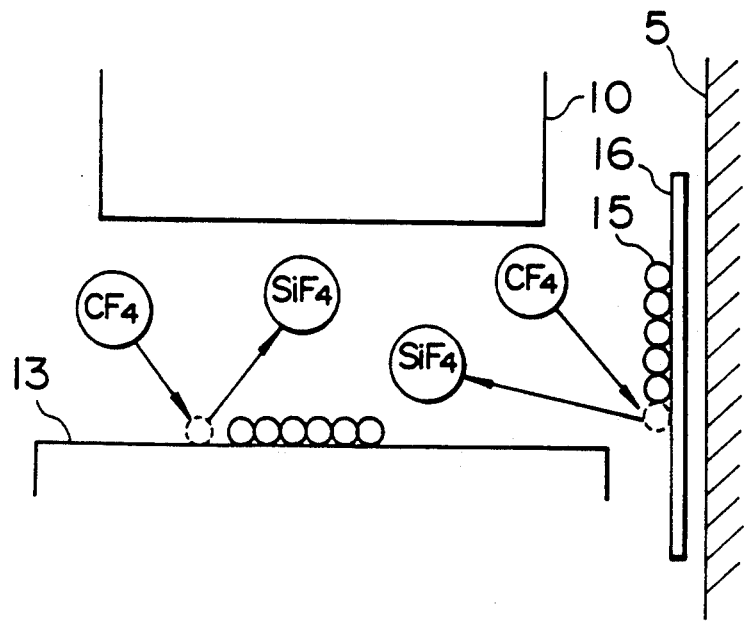
FIG. 3 is an enlarged fragmentary view of the inside of the vacuum vessel, showing a process of cleaning the inside of the vacuum vessel according to the present invention, the cleaning process employing plasma.

The configuration shown in FIG. 1 will be explained. In this configuration, 5 designates the vacuum chamber, 6 designates a main pump, and 7 designates an oil-sealed rotary pump 7 having an anti-corrosion against a reactive gas. An example of a pump usable as the main pump 6 is a turbo-molecular pump. An example of a gas usable as the reactive gas is $CF_4$, $CF_4+O_2$, $NF_3$, or a chlorine-based gas. In this embodiment, $CF_4$ is used. The configuration also includes an argon (Ar) gas cylinder 8, and a reactive gas cylinder 9. Each of these cylinders 8 and 9 is provided with a gas introducing system for supplying the gas in the cylinder to the inside of the vacuum chamber 5. A wafer 11 (such as a silicon substrate) is disposed at an upper position inside the vacuum chamber 5 while being held by a wafer holder 10. The wafer 11 is always positioned with its surface to be etched being directed downward. This position of the wafer 11, in which the surface to be processed is directed downward, makes it possible to prevent particles from falling under the influence of their own gravity onto the surface of the wafer 11. A counter electrode 13, housing a magnet 12 therein, is disposed at a lower position inside the vacuum chamber 5. A high-frequency power source 14 (e.g., an RF power source) is connected between the wafer holder 10 and the counter electrode 13. When a high-frequency power is applied under predetermined conditions by the high-frequency power source 14, magnetron discharge is caused by crossed electric and magnetic fields. As shown in FIGS. 1 and 3, shield plates 16, on which silicon atoms 15 may deposit, are arranged in the vicinity of the inner wall surfaces of the vacuum chamber 5. Further, a plurality of heaters 17 (shown in FIG. 1) are disposed at predetermined positions close to inner wall portions of the vacuum chamber 5. Although not shown, a power source is provided to supply electric power to the heaters 17.

The sputtering apparatus having the above-described configuration operates in the following manner. A product wafer lot comprising a predetermined number of wafers (e.g., 25 to 50 wafers) is transferred by a transfer mechanism, for example, a transfer robot, into the vacuum chamber 5. FIG. 1 shows only one wafer 11 in order to simplify the illustration. Before each wafer 11 is set for the sputtering process, it is set for the etching process employing an argon gas in order to remove contamination from the wafer surface. The oil-sealed rotary pump 7 and the main pump 6 (the pump 6 being capable of evacuating the inside of the vacuum chamber 5 to bring it into an ultra low pressure condition) are used to set the internal pressure within the vacuum chamber 5 to a predetermined pressure. Thereafter, communication is established between the inside of the chamber 5 and the gas introducing system for the Ar gas cylinder 8, thereby introducing Ar gas into the vacuum chamber 5. After the introduction is completed, when high-frequency power is applied by the high-frequency power source 14 (such as an RF power source or a microwave power source), magnetron discharge is caused by the crossed electric and magnetic fields. When the magnetron discharge is thus caused, its self-bias effect causes argon ions to be impinged onto the surfaces of the predetermined number of wafers 11, thereby causing the surfaces of the wafers to be etched. Thus, contamination on the surface of the wafer 11 is removed.

When etching employing the argon gas has been completed with respect to all of the predetermined number of wafers 11, the introduction of argon gas from the gas cylinder 8 into the vacuum chamber 5 is stopped. Subsequently, the wafers 11 etched with argon ions are taken out of the vacuum chamber 5 by the transfer robot (not shown) and, instead of the wafers 11, a simulation wafer for particle checking is placed inside the vacuum chamber 5. At this time, particles which have been generated in the vacuum chamber 5 adhere to the surface of the simulation wafer for particle checking. Thereafter, the simulation wafer is taken out of the vacuum chamber 5, and the particles adhered to the simulation wafer are counted to check, on the basis of the number of the particles counted, the degree of the generation of particles in the vacuum chamber 5. In this embodiment, the device used to count the particles is a particle check counter which employs a light scattering method and which is sold on the market. In the particle checking, a certain determination standard is set, which is, for instance, the standard that the number of particles of a size of 0.28 $\mu$m or more in diameter per 6-inch diameter simulation wafer surface should not exceed thirty. If the actual number of the particles exceeds this determination standard, it is determined that the shield plate, etc. need to be cleaned.

When it is determined, as a result of the particle checking, that the degree of particle generation exceeds the standard, the gas introducing system for the reactive gas cylinder 9 is brought into communication with the interior of the vacuum chamber 5, thereby introducing the reactive gas into the vacuum chamber 5. The introduction of the reactive gas allows the inside of the vacuum chamber 5 to be subjected to cleaning employing plasma (hereinafter referred to as "plasma cleaning"), to thereby cope with silicon films deposited on inner wall surfaces of the chamber 5 and the counter electrode 13. The plasma is preferably produced by magnetron discharge. A method usable to cause the magnetron discharge is a method in which magnetron discharge is caused, similarly to magnetron discharge in the etching of the wafers 11, by applying the high-frequency power by means of the high-frequency power source 14. As shown in FIG. 3, in the plasma cleaning according to the present invention, an etching action due to the reactive gas $CF_4$ causes silicon (Si) films 15, which have deposited on the surfaces of the shield plates 16 and the counter electrode 13, and silicon particles, which have been generated in the vacuum chamber 5, to be gasified. The thus generated gas ($SiF_4$) is immediately evacuated to the outside of the chamber 5 by the main pump 6. In this evacuating, it is preferable, in order to increase the processing efficiency, that the inner walls of the chamber 5 and the shield plates 16 should be heated by the heaters 17. Thus, the silicon deposited films on the shield plates 16, as well as the particles existing in the chamber 5, are removed by the plasma cleaning. The period of time required for the above plasma cleaning is about thirty minutes when the product wafer lot comprises 50 wafers.

Figure 4:
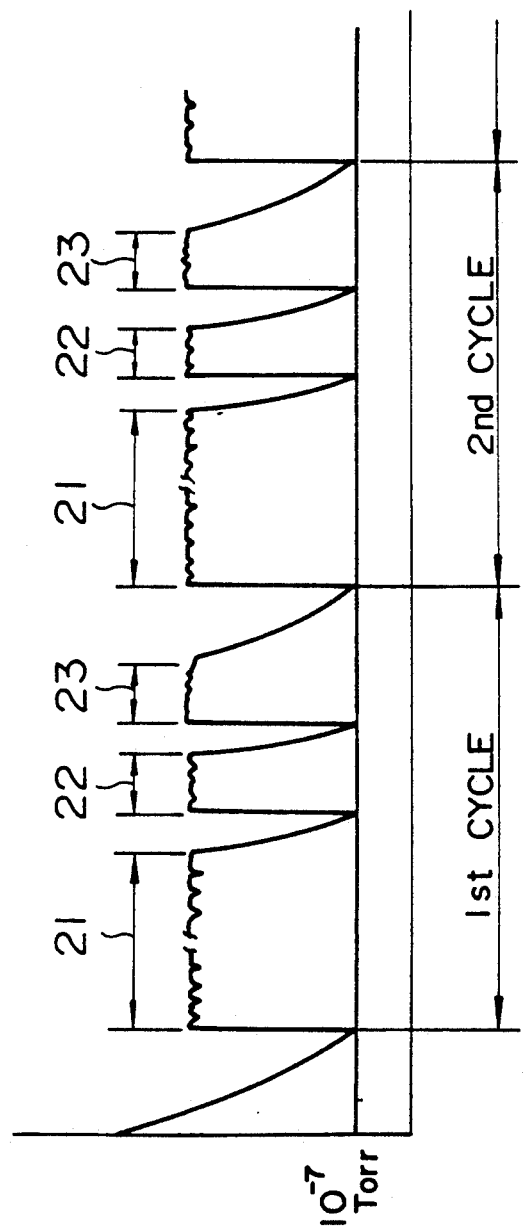
FIG. 4 is a timing chart showing a part of the processes of a sputtering method embodiment according to the present invention.
Figure 7:
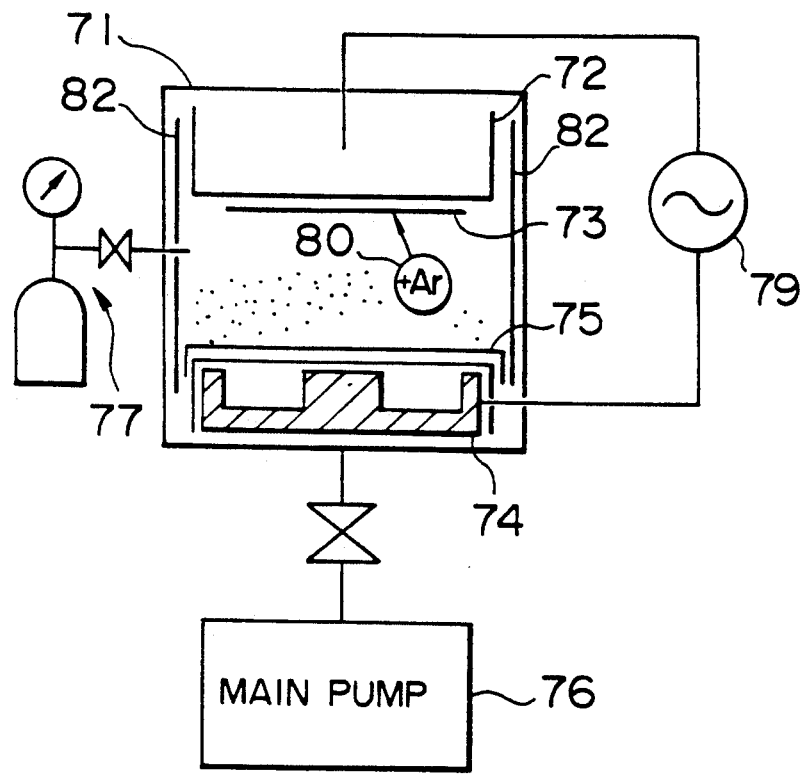
FIG. 7 is a structural view of the vacuum vessel of a conventional sputtering apparatus, the vacuum vessel being for use in a wafer surface cleaning process.
Figure 8:
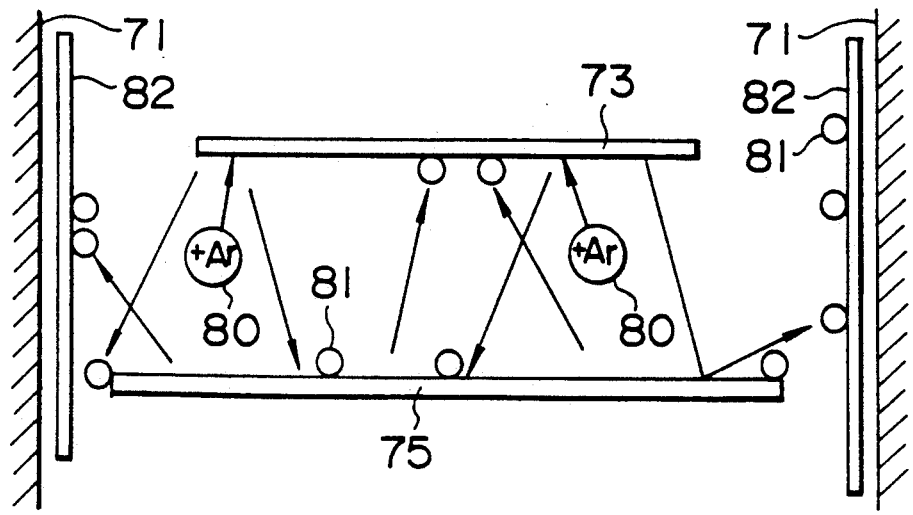
FIG. 8 is a view for illustrating the generation of silicon films caused by a conventional etching for cleaning the wafer surface.

If the above-described procedures from the etching to the plasma cleaning are illustrated by a timing chart, the chart will be such as that shown in FIG. 4. Referring to FIG. 4, during a period of time 21 corresponding to an etching stage, a plurality of, e.g., fifty, silicon wafers are etched one by one. A subsequent period of time 22 corresponds to a checking stage, in which the degree (number) of generated particles is checked. Then, during another period of time 23, a plasma cleaning stage takes place. Thereafter, with respect to a subsequent product wafer lot, the etching stage 21 employing the argon gas, the particle checking stage 22, and the plasma cleaning stage 23 are again executed. FIG. 4 illustrates an example in which the particle checking is always followed by the plasma cleaning.

When the transfer robot is operated and thereby each wafer 11 is transferred between the etching vacuum chamber 5 and the separation chamber 1, it is possible to reduce the risk of particle adhesion to the wafer. This is because the wafer can be transferred while its surface to be processed is directed downward, thereby minimizing the area that may come into contact with the particles. The details of the transfer robot is disclosed in, for instance, International Publication No. WO 91/07773.

As stated before, the heaters 17 are preferably used in evacuation in order to curtail the period of time required for evacuation, after the introduction of the $CF_4$ gas has been stopped, the interior of the vacuum chamber 5 to a predetermined pressure (approximately from $10^{-6}$ to $10^{-7}$ Torr). Thus, the use of the heaters 17 is preferable because it promotes the desorption of $CF_4$ molecules adhered to the inner wall surfaces of the vacuum chamber 5 and the shield plates 16. The temperature of the inner wall surfaces and the shield plates 16 is set approximately at 100° C. by the heaters 17. It is also effective for the evacuation of the $CF_4$ gas to improve the pumping characteristic of the main pump 6, which provides a substantial pumping speed, from the viewpoint of the evacuation conductance.

Certain experimental examples will be described. FIGS. 5A and 5B are graphs showing residue gas spectrum patterns obtained by a quadrupole mass spectrometer under two different conditions after the introduction of the $CF_4$ gas into the vacuum chamber 5. In the graphs, the axis of abscissa represents the mass number, and the axis of ordinate represents the ion current value corresponding to the peak intensity. FIG. 5A shows a gas spectrum pattern obtained after the introduction of the $CF_4$ gas into the vacuum chamber 5, whereas FIG. 5B shows a gas spectrum pattern obtained after discharge in the $CF_4$ gas. After the discharge, three peaks, namely, $SiF_3$, $SiF_2$ and $SiF$ peaks, appear. On the basis of the above-described observation results, a certain phenomenon has been confirmed, in which reactions in the plasma cleaning are promoted, and silicon deposited films on the shield plates 16 and the counter electrode 13 are removed therefrom.

FIG. 6 is a graph showing different characteristics corresponding to the execution and non-execution of the plasma cleaning employing the $CF_4$ gas, the graph being obtained by observing actual changes in the particle number. In FIG. 6, the axis of abscissa represents the total etching amount, and the axis of ordinate represents the particle number. In accordance with a characteristic A obtainable with a conventional etching, that is, in cases where no $CF_4$ plasma cleaning is performed, the amount of polysilicon (Si) deposited films increases. More specifically, as the total etching amount increases, the particle number rapidly increases. In contrast, in accordance with a characteristic B achievable in cases where the $CF_4$ plasma cleaning is performed, increases in the degree of particle generation are restrained by periodically executing the $CF_4$ plasma cleaning each time a predetermined number of wafers have been subjected to etching, thereby making it possible to maintain the particle number at an acceptable level (at the initial value level).

As described above, the plasma cleaning is performed in a time interval between two successive Ar etching processes for etching product wafer lots. In order to realize this arrangement, it is necessary to prepare a pumping system enabling a switching from the $CF_4$ gas to the Ar gas to be completed within a short period of time. This preparation allows the Ar etching of wafers to be performed without reducing the throughput.

Any gas may be used as the reactive gas for the plasma cleaning so long as the gas is capable of reacting with the deposited silicon, and causing the silicon to be transformed into a gaseous form, and then evacuated to the outside of the vacuum chamber 5. Although in the above-described embodiments the argon (Ar) gas is used as the etching gas, the present invention may be effectively applied to cases where a gas other than the Ar gas is used to remove silicon deposited films.

In the above-described embodiments, a thin film deposition apparatus employing the sputtering process has been described. However, the present invention may be applied to other similar thin film deposition apparatuses.

As has been described above, according to the present invention, in the thin film deposition apparatus, the particles generated in the etching process performed as a pretreatment process in advance of the sputtering process can be curbed into a desired condition, while making it also possible to curtail the maintenance period in a thin film deposition operation by the thin film deposition apparatus, and to maintain the wafer productivity at a high level. Further, when performing the etching process for the purpose of cleaning wafer surfaces, the number of the particles generated in the chamber is often checked, thereby making it possible to efficiently and appropriately remove the deposited films and the particles within the chamber.

We claim:

1. A thin film deposition method including a cleaning process executed in a first vacuum vessel provided exclusively for an etching process prior to depositing a thin film on a wafer in a second vacuum vessel provided exclusively for a deposition process, said method comprising the steps of:
   (a) cleaning a downward oriented surface of a fixed number of wafers by etching with an inert gas which is introduced into said first vacuum vessel and afterward transformed into a plasma therein;
   (b) checking a number of particles on the surface of a simulation wafer which is set in said first vacuum vessel after said fixed number of said wafers are cleaned;
   (c) determining whether the number of said particles exceeds a standard number;
   (d) if the number of said particles exceeds the standard number, gasifying said particles and deposited films in said first vacuum vessel without heating said first vacuum vessel by using a reactive gas which is introduced into said first vacuum vessel and afterward transformed into a plasma therein; and
   (e) evacuating a gas generated by said gasifying in said first vacuum vessel, said first vacuum vessel comprising shield plates disposed in the vicinity of walls on which films are deposited, wherein the shield plates are heated up to about 100° C., and the internal pressure of said first vacuum vessel is reduced to a reference pressure.

2. A thin film deposition method according to claim 1 wherein a series of the steps including said cleaning step, said particle checking step, said particle number determining step, said gasifying step and said evacuating step, is repeatedly executed in turn.

3. A thin film deposition method according to claim 1 wherein the surface of said wafer to be processed is directed downward when said wafer is transferred into or out of said first vacuum vessel.

4. A thin film deposition method according to claim 1 wherein said plasma in said cleaning step and said gasifying step is produced by magnetron discharge.

5. A thin film deposition method according to claim 1 wherein said reactive gas is $CF_4$.

6. A thin film deposition method according to claim 1 wherein said predetermined number of said wafers to be cleaned is fifty.

7. A thin film deposition method according to claim 1, wherein said standard number is not less than thirty, when the diameter of said particle is 0.28 $\mu$m or more and the diameter of said simulation wafer is 6 inches.

8. A thin film deposition method according to claim 1 wherein said inert gas is argon.

9. A thin film deposition method according to claim 1, wherein said reference pressure is approximately from $10^{-6}$ to $10^{-7}$ Torr.

* * * * *